(12) United States Patent
Kim

(10) Patent No.: US 8,716,702 B2
(45) Date of Patent: May 6, 2014

(54) ORGANIC LIGHT-EMITTING DISPLAY DEVICE AND METHOD OF MANUFACTURING THE SAME

(75) Inventor: Sung-Ho Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 95 days.

(21) Appl. No.: 13/209,290

(22) Filed: Aug. 12, 2011

(65) Prior Publication Data
US 2012/0097957 A1    Apr. 26, 2012

(30) Foreign Application Priority Data
Oct. 22, 2010    (KR) ......................... 10-2010-0103667

(51) Int. Cl.
*H01L 29/08*    (2006.01)
*H01L 35/24*    (2006.01)
*H01L 51/00*    (2006.01)

(52) U.S. Cl.
USPC .......... 257/40; 257/59; 257/72; 257/E51.018; 257/E51.026

(58) Field of Classification Search
USPC ................ 257/40, 59, 72, E51.018, E51.026
See application file for complete search history.

(56) References Cited

U.S. PATENT DOCUMENTS

| 5,610,082 | A | 3/1997 | Oh | |
| 8,013,341 | B2* | 9/2011 | Jun et al. | 257/72 |
| 2006/0175961 | A1 | 8/2006 | Choong | |
| 2011/0012118 | A1* | 1/2011 | Yamazaki et al. | 257/59 |
| 2011/0127499 | A1* | 6/2011 | Yoon et al. | 257/40 |
| 2011/0227878 | A1* | 9/2011 | Makita | 345/175 |
| 2012/0319124 | A1* | 12/2012 | Kim et al. | 257/72 |
| 2013/0015439 | A1* | 1/2013 | Yamazaki et al. | 257/43 |
| 2013/0228760 | A1* | 9/2013 | Park et al. | 257/40 |

FOREIGN PATENT DOCUMENTS

| JP | 10-223911 A | 8/1998 |
| JP | 2005-072002 A | 3/2005 |
| JP | 2006-222082 A | 8/2006 |
| JP | 2006-237512 A | 9/2006 |
| KR | 1994-0019005 | 8/1994 |
| KR | 10-2005-0028567 A | 3/2005 |
| KR | 10-2005-0035806 A | 4/2005 |
| KR | 10-2009-0060851 A | 6/2009 |

OTHER PUBLICATIONS

Machine English Translation of JP 10-223911 A.
Machine English Translation of JP 2005-072002 A.
Machine English Translation of JP 2006-237512 A.

* cited by examiner

*Primary Examiner* — Victor A Mandala
(74) *Attorney, Agent, or Firm* — Christie, Parker & Hale, LLP

(57) ABSTRACT

An organic light-emitting display device includes: a buffer layer including sequentially stacked materials having different refractive indexes on a substrate; source and drain electrodes on the buffer layer; a first active layer of a thin film transistor between the source and drain electrodes, and a second active layer spaced from the first active layer at a same layer as and including a same material as the first active layer; a first insulation layer on the buffer layer, the source and drain electrodes, the first and second active layers, and including sequentially stacked materials having different refractive indexes; a first gate electrode corresponding to a center region of the first and second active layers with the first insulation layer therebetween, and a pixel electrode at a same layer as and comprising a same material as the first gate electrode; and a second gate electrode on the first gate electrode.

16 Claims, 12 Drawing Sheets

ORGANIC LIGHT-EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2010-0103667, filed on Oct. 22, 2010, in the Korean Intellectual Property Office, the disclosure of which is incorporated herein in its entirety by reference.

BACKGROUND

1. Field

Embodiments according to the present invention relate to an organic light-emitting display device and a method of manufacturing the same.

2. Description of the Related Art

Flat panel display devices, such as organic light-emitting display devices, liquid crystal display devices, etc., are manufactured on a substrate on which a pattern, including a thin film transistor, a capacitor, and a wire connecting the thin film transistor and the capacitor, is formed.

Generally, in order to form a pattern having a minute structure including a thin film transistor, etc., the pattern is transferred to a substrate on which a flat panel display is manufactured, by using a mask on which such a pattern is formed.

The light efficiency of an organic light-emitting display device is classified into internal efficiency and external efficiency. Here, the internal efficiency depends on photoelectric conversion efficiency of an organic light-emitting material, and the external efficiency depends on a refractive index of each layer forming the organic light-emitting display device. Here, since the organic light-emitting display device has lower light coupling efficiency, i.e., the external efficiency, than other display devices, such as cathode-ray tubes and plasma display panels (PDPs), it is desirable to further improve some characteristics, such as luminance, lifetime, etc., of the organic light-emitting display device.

SUMMARY

Embodiments according to the present invention provide an organic light-emitting display device having improved light efficiency by realizing an optical resonance effect, and a method of manufacturing the same.

According to an aspect of one embodiment of the present invention, there is provided an organic light-emitting display device including: a buffer layer on a substrate and comprising sequentially stacked materials having different refractive indexes; source and drain electrodes on the buffer layer and spaced apart from each other; a first active layer of a thin film transistor between the source and drain electrodes, and a second active layer spaced apart from the first active layer at a same layer as the first active layer and including a same material as the first active layer; a first insulation layer on the buffer layer, the source and drain electrodes, and the first and second active layers, the first insulation layer comprising sequentially stacked materials having different refractive indexes; a first gate electrode corresponding to a center region of the first active layer with the first insulation layer therebetween, and a pixel electrode spaced apart from the first gate electrode at a same layer as the first gate electrode and including a same material as the first gate electrode; and a second gate electrode on the first gate electrode.

According to an aspect of another embodiment of the present invention, there is provided an organic light-emitting display device including: a buffer layer on a substrate and comprising sequentially stacked materials having different refractive indexes; a gate electrode on the buffer layer; a first insulation layer on the buffer layer and the gate electrode, and comprising sequentially stacked materials having different refractive indexes; a first active layer corresponding to the gate electrode with the first insulation layer therebetween, and a second active layer spaced apart from the first active layer at a same layer as the first active layer and comprising a same material as the first active layer; a first source electrode and a first drain electrode contacting the first active layer, and a pixel electrode extending from one end of the first drain electrode; and a second source electrode and a second drain electrode on the first source electrode and the first drain electrode, respectively.

The buffer layer may include at least two layers each including at least one of silicon oxide (SiOx), silicon nitride (SiNx), titanium dioxide ($TiO_2$), hafnium dioxide ($HfO_2$), aluminum oxide ($Al_2O_3$), hafnium silicon oxide (HfSiOx), tantalum pentoxide ($Ta_2O_5$), niobium pentoxide ($Nb_2O_5$), zirconium dioxide ($ZrO_2$), yttrium oxide ($Y_2O_3$), or lanthanum oxide ($La_2O_3$).

The buffer layer may include an upper buffer layer including SiOx, and a lower buffer layer including SiNx.

The first insulation layer may include at least two layers each including at least one of SiOx, SiNx, $TiO_2$, $HfO_2$, $Al_2O_3$, HfSiOx, $Ta_2O_5$, $Nb_2O_5$, $ZrO_2$, $Y_2O_3$, $La_2O_3$, or aluminum zinc oxide (AZO).

The first insulation layer may include an upper first insulation layer including SiNx, and a lower first insulation layer including SiOx.

The organic light-emitting display device may further include: a lower electrode of a capacitor spaced apart from the source and drain electrodes at a same layer as the source and drain electrodes, and including a same material as the source and drain electrodes; a first upper electrode on the lower electrode of the capacitor at a same layer as the first gate electrode, and including a same material as the first gate electrode; and a second upper electrode on the first upper electrode of the capacitor at a same layer as the second gate electrode, and including a same material as the second gate electrode.

The organic light-emitting display device may further include: a lower electrode of a capacitor spaced apart from the gate electrode at a same layer as the gate electrode, and including a same material as the gate electrode; a first upper electrode on the lower electrode of the capacitor at a same layer as the first source electrode and the first drain electrode, and including a same material as the first source electrode and the first drain electrode; and a second upper electrode on the first upper electrode of the capacitor at a same layer as the second source electrode and the second drain electrode, and including the same material as the second source electrode and the second drain electrode.

The organic light-emitting display device may further include a pixel defining layer at an edge of the pixel electrode so as to expose the pixel electrode.

The first and second active layers may include an oxide semiconductor.

According to an aspect of another embodiment of the present invention, there is provided a method of manufacturing an organic light-emitting display device, the method including: forming a buffer layer on a substrate by sequentially stacking materials having different refractive indexes; performing a first mask process by forming a first conductive layer on the buffer layer, and patterning the first conductive layer into source and drain electrodes of a thin film transistor; performing a second mask process by forming a semiconductor layer on the structure obtained by performing the first mask process, and patterning the semiconductor layer into first and second active layers; performing a third mask process by forming a first insulation layer on the structure obtained by performing the second mask process, and removing a part of the first insulation layer so that a part of the source and drain electrodes is exposed; performing a fourth mask process by sequentially forming a second conductive layer and a third conductive layer on the structure obtained by performing the third mask process, and concurrently patterning the second and third conductive layers into a first gate electrode and a second gate electrode of the thin film transistor, and a pixel electrode; and performing a fifth mask process by forming a second insulation layer on the structure obtained by performing the fourth mask process, and removing the second insulation layer so that the pixel electrode is exposed.

According to an aspect of another embodiment of the present invention, there is provided a method of manufacturing an organic light-emitting display device, the method including: forming a buffer layer on a substrate by sequentially stacking materials having different refractive indexes; performing a first mask process by forming a first conductive layer on the buffer layer and patterning the first conductive layer into a gate electrode of a thin film transistor; performing a second mask process by forming a first insulation layer on the structure obtained by forming and patterning the first conductive layer by sequentially stacking materials having different refractive indexes, forming a semiconductor layer on the first insulation layer, and patterning the semiconductor layer into first and second active layers; performing a third mask process by forming a second insulation layer on the structure obtained by performing the second mask process, and patterning the second insulation layer into an etch stop layer; performing a fourth mask process by sequentially forming a second conductive layer and a third conductive layer on the structure obtained by performing the third mask process, and concurrently patterning the second and third conductive layers into source and drain electrodes of the thin film transistor, and a pixel electrode; and performing a fifth mask process by forming a third insulation layer on the structure obtained by performing the fourth mask process, and removing the third insulation layer so that the pixel electrode is exposed.

The performing of the fourth mask process may be performed by using a half-tone mask including a semi-permeable portion formed on a location corresponding to the pixel electrode.

The forming of the buffer layer may include forming at least two layers each comprising at least one of SiOx, SiNx, $TiO_2$, $HfO_2$, $Al_2O_3$, HfSiOx, $Ta_2O_5$, $Nb_2O_5$, $ZrO_2$, $Y_2O_3$, or $La_2O_3$.

The buffer layer may include an upper buffer layer including SiOx, and a lower buffer layer including SiNx.

The forming of the first insulation layer may include forming at least two layers each including at least one of SiOx, SiNx, $TiO_2$, $HfO_2$, $Al_2O_3$, HfSiOx, $Ta_2O_5$, $Nb_2O_5$, $ZrO_2$, $Y_2O_3$, $La_2O_3$, or AZO.

The first insulation layer may include a first upper insulation layer including SiNx, and a first lower insulation layer including SiOx.

The second conductive layer may include at least one of ITO, IZO, ZnO, or $In_2O_3$.

The third conductive layer may include at least one material selected from the group consisting of Ag, Mg, Al, Pt, Pd, Au, Ni, Nd, Ir, Cr, Li, Ca, Mo, Ti, W, MoW, Al/Cu, and combinations thereof.

The first and second active layers may include an oxide semiconductor.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, the present invention will be described more fully with reference to the accompanying drawings, in which exemplary embodiments of the invention are shown.

Figure 13:
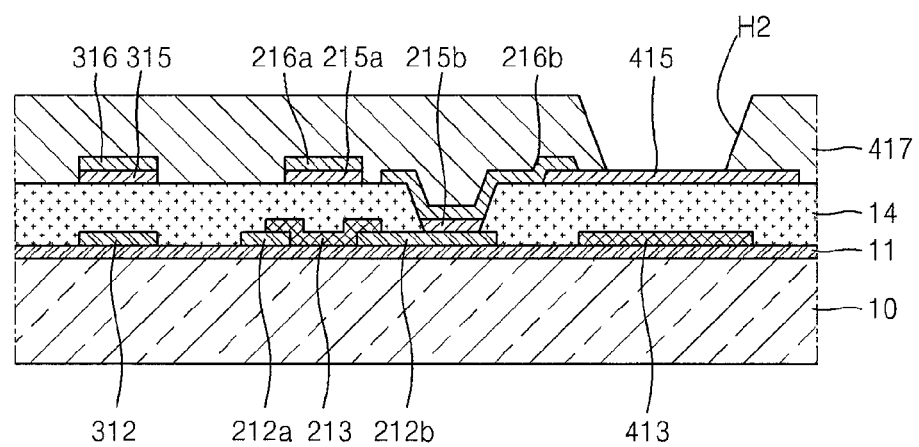
Figure 14:
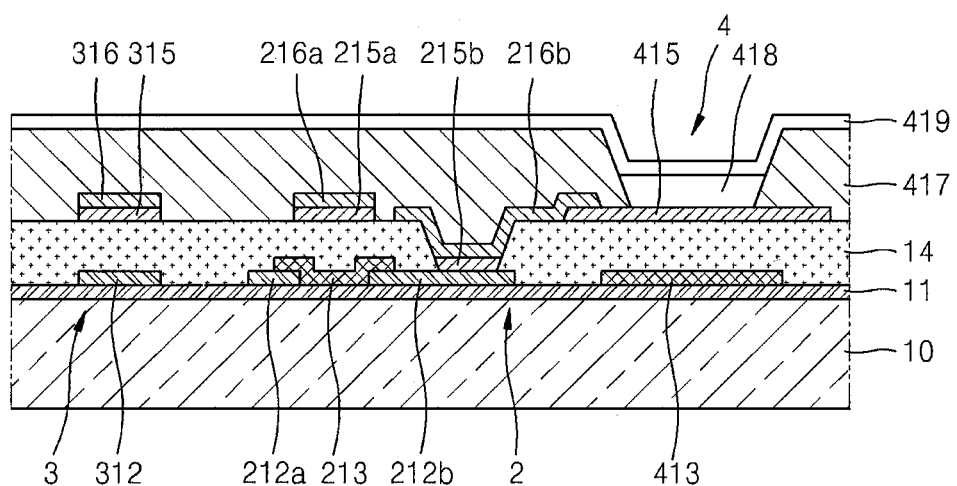
FIG. 14 is a cross-sectional view schematically illustrating an organic light-emitting display device manufactured according to the method of FIGS. 1 through 13.

FIGS. 1 through 13 are cross-sectional views illustrating a method of manufacturing an organic light-emitting display device, according to an embodiment of the present invention, and FIG. 14 is a cross-sectional view schematically illustrating an organic light-emitting display device manufactured according to the method of FIGS. 1 through 13.

Referring to FIGS. 1 through 14, the organic light-emitting display device according to one embodiment includes a substrate 10, a buffer layer 11, a thin film transistor 2, a capacitor 3, and an organic light-emitting device 4.

Figure 1:
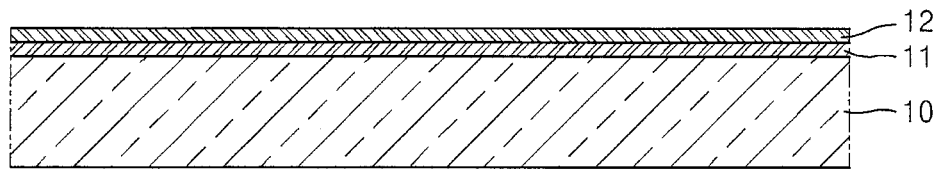
FIGS. 1 through 13 are cross-sectional views illustrating a method of manufacturing an organic light-emitting display device, according to an embodiment of the present invention.

Referring to FIG. 1, the buffer layer 11 and a first conductive layer 12 are sequentially formed on the substrate 10.

The substrate 10 may be formed of a transparent glass material containing silicon oxide ($SiO_2$) as a main component. Alternatively, the substrate 10 may be formed of an opaque material or another material, such as plastic. However, when the organic light-emitting display device is a bottom emission type, wherein an image is displayed through the substrate 10, the substrate 10 is formed of a transparent material.

The buffer layer 11 may be formed on a top surface of the substrate 10 so as to flatten (e.g., planarize) the substrate 10 and prevent impure elements from penetrating into the substrate 10. The buffer layer 11 may be formed by depositing $SiO_2$ and/or silicon nitride (SiNx) by using any deposition method, such as a plasma-enhanced chemical vapor deposition (PECVD) method, an atmospheric pressure CVD (APCVD) method, or a low-pressure CVD (LPCVD) method. Alternatively, the buffer layer 11 may include at least one of titanium dioxide ($TiO_2$), hafnium dioxide ($HfO_2$), aluminum oxide ($Al_2O_3$), hafnium silicon oxide (HfSiOx), tantalum pentoxide ($Ta_2O_5$), niobium pentoxide ($Nb_2O_5$), zirconium dioxide ($ZrO_2$), yttrium oxide ($Y_2O_3$), or lanthanum oxide ($La_2O_3$). Here, in the organic light-emitting display device according to one embodiment of the present invention, the buffer layer 11 forms an optical resonance structure as the buffer layer 11 has a multi-layer structure wherein materials having different refractive indexes are sequentially stacked on one another. The optical resonance structure of the buffer layer 11 will be described in detail later.

The first conductive layer 12 is deposited on the buffer layer 11. The first conductive layer 12 may include at least one material selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, Al/copper (Cu), and combinations thereof. Alternatively, the first conductive layer 12 may include at least one material selected from the group consisting of transparent materials, such as indium tin oxide (ITO), indium zinc oxide (IZO), zinc oxide (ZnO), and indium oxide ($In_2O_3$). The first conductive layer 12 is patterned into source and drain electrodes 212a and 212b of the thin film transistor 2, and a part of a lower electrode 312 of the capacitor 3, which will be described later.

Figure 2:
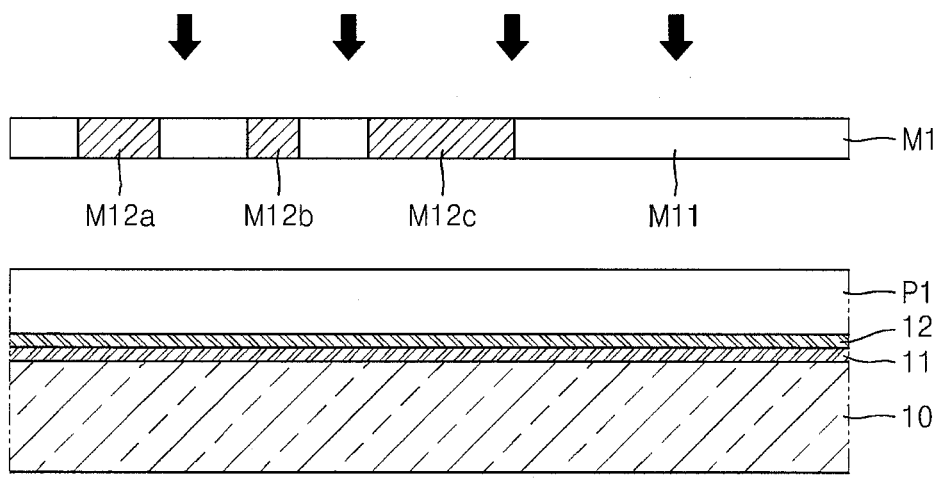

Next, referring to FIG. 2, a photoresist layer P1 is formed by removing a photoresist coated on top of a structure of FIG. 1 by using a solvent via pre-baking or soft baking, and then a first mask M1, including a pattern (e.g., predetermined pattern) for patterning the photoresist layer P1, is prepared and arranged on the substrate 10. Here, the first mask M1 includes a light-transmitting portion M11 and light-blocking portions M12a, M12b, and M12c. The light-transmitting portion M11 transmits light (e.g., light having a predetermined wavelength band), and the light-blocking portions M12a, M12b, and M12c block irradiated light. Then, after light exposure and developing processes on the photoresist layer P1, an etching process is performed on the photoresist layer P1 by using a remaining photoresist layer pattern as a mask.

Figure 3:
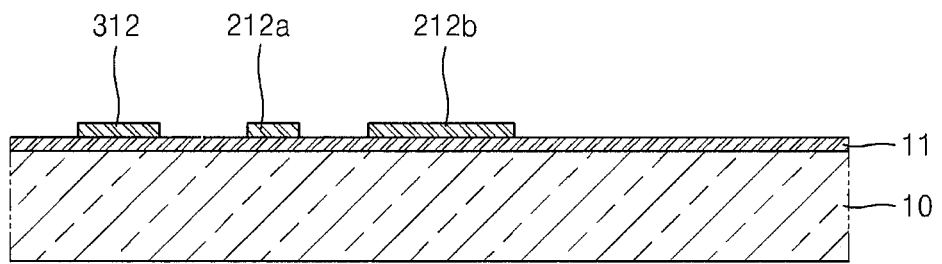

Then, referring to FIG. 3, the source and drain electrodes 212a and 212b are formed on the buffer layer 11 as a result of a first mask process. Also, the lower electrode 312 of the capacitor 3 is formed of the same material and at the same layer as the source and drain electrodes 212a and 212b. Here, the lower electrode 312 may be formed concurrently with the source and drain electrodes 212a and 212b.

Figure 4:
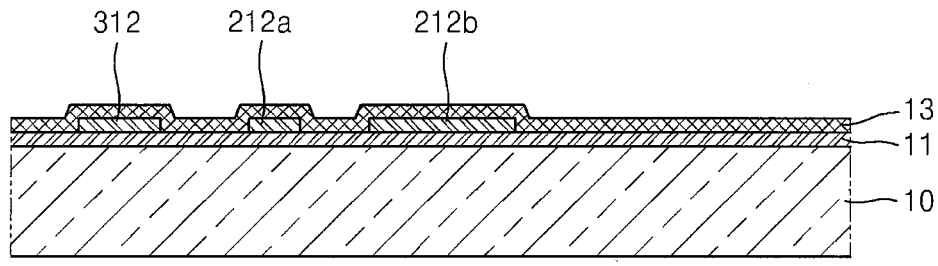

Then, referring to FIG. 4, a semiconductor layer 13 is formed on the buffer layer 11, the source and drain electrodes 212a and 212b, and the lower electrode 312.

The semiconductor layer 13 may be formed of an oxide semiconductor, and for example, may include oxygen and at least one element selected from the group consisting of Ga, In, Zn, Hf, and combinations thereof. For example, the semiconductor layer 13 may include ZnO, ZnGaO, ZnInO, GaInO, GaSnO, ZnSnO, InSnO, HfInZnO, or ZnGaInO, and for further example, may be a G-I—Z—O layer [a($In_2O_3$)b($Ga_2O_3$)c(ZnO) layer], wherein a, b, and c are each a real number satisfying a condition of a≥0, b≥0, and c>0. Such a semiconductor layer 13 formed of the oxide semiconductor is patterned into an active layer 213 of the thin film transistor 2 and an active layer 413 of the organic light-emitting device 4.

Figure 5:
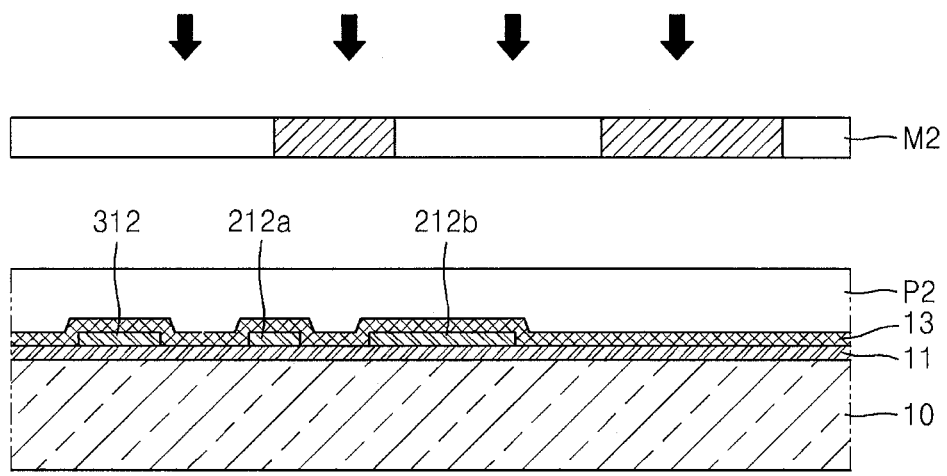

Then, referring to FIG. 5, a photoresist layer P2 is formed by removing a photoresist coated on top of a structure of FIG. 4 by using a solvent via pre-baking or soft baking, and then a second mask M2, including a pattern (e.g., a predetermined pattern) for patterning the photoresist layer P2, is prepared and arranged on the substrate 10. Then, after light exposure and developing processes on the photoresist layer P2, an etching process is performed on the photoresist layer P2 by using a remaining photoresist layer pattern as a mask.

Figure 6:
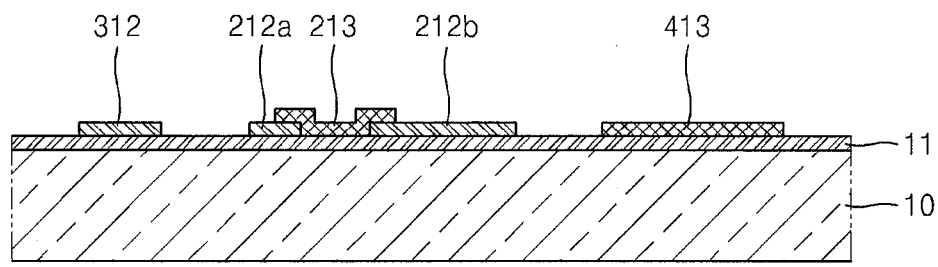

Next, referring to FIG. 6, the active layer 213 of the thin film transistor 2 is formed on top of the buffer layer 11, the source and drain electrodes 212a and 212b, and the lower electrode 312 as a result of a second mask process. Also, the active layer 413 of the organic light-emitting device 4 is formed of the same material and at the same layer as the active layer 213. For example, the active layer 413 may be formed concurrently with the active layer 213.

Figure 7:
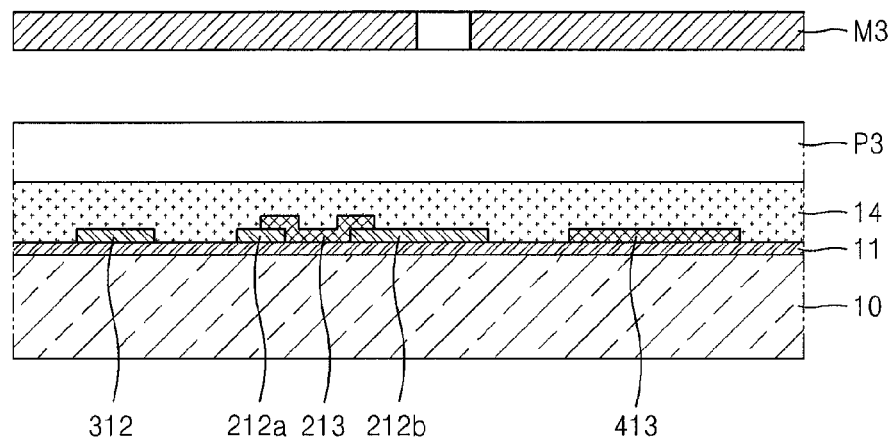

Next, referring to FIG. 7, a first insulation layer 14 is deposited on a structure of FIG. 6, constituting the result of the second mask process, a photoresist layer P3 is formed on the first insulation layer 14, and a third mask M3 is arranged on the photoresist layer P3.

For example, the first insulation layer 14 may be formed by depositing an inorganic insulation layer formed of SiNx or SiOx via a PECVD method, an APCVD method, or an LPCVD method. Alternatively, the first insulation layer 14 may include at least one of $TiO_2$, $HfO_2$, $Al_2O_3$, HfSiOx, $Ta_2O_5$, $Nb_2O_5$, $ZrO_2$, $Y_2O_3$, $La_2O_3$, and aluminum zinc oxide (AZO). The first insulation layer 14 is located between the active layer 213 of the thin film transistor 2 and a first gate electrode 215a of FIG. 14 to operate as a gate insulation layer of the thin film transistor 2, and at the same time, is located between the lower electrode 312 of the capacitor 3 and a first upper electrode 315 of FIG. 14 to operate as a first dielectric layer of the capacitor 3, which will be described later. Also, the first insulation layer 14 is located between the active layer 413 of the organic light-emitting device 4 and a pixel electrode 415 of FIG. 14 to operate as an insulation layer of the organic light-emitting device 4 for resonance, which will be described later. Accordingly, the first insulation layer 14 of the organic light-emitting display device according to one embodiment of the present invention has a multi-layer structure wherein materials having different refractive indexes are sequentially stacked on one another, as will be described later in detail.

Then, the third mask M3, including a pattern (e.g., a predetermined pattern), is arranged on the substrate 10, and the photoresist layer P3 is exposed to light.

Figure 8:
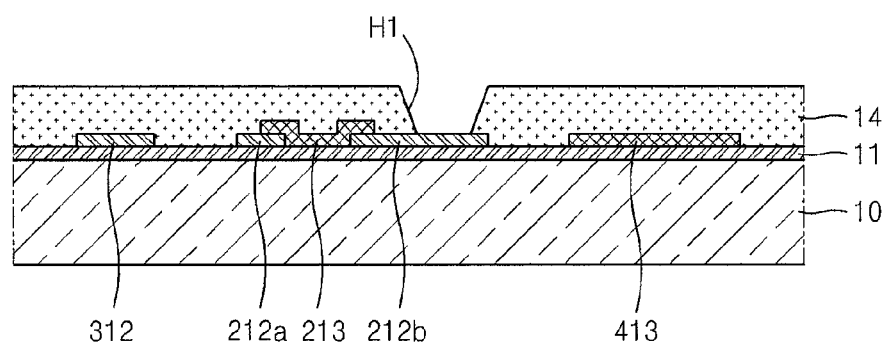

FIG. 8 schematically illustrates the organic light-emitting display device obtained after removing an exposed portion of the photoresist layer P3 and etching the photoresist layer P3 by using a remaining photoresist layer pattern as a mask.

Referring to FIG. 8, an opening H1, exposing a partial region corresponding to the drain electrode 212b, is formed.

Figure 9:
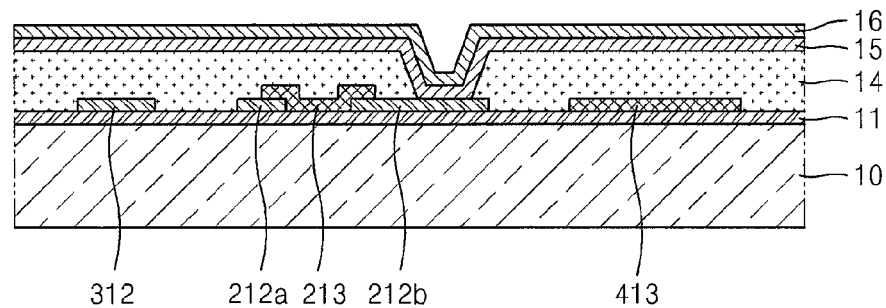

Next, referring to FIG. 9, a second conductive layer 15 and a third conductive layer 16 are sequentially deposited on a structure of FIG. 8, constituting a result of a third mask process of FIG. 8.

The second conductive layer 15 may include at least one material selected from transparent materials, such as ITO, IZO, ZnO, and $In_2O_3$. The second conductive layer 15 becomes a part of the pixel electrode 415 of the organic light-emitting display device, a part of the first gate electrode 215a and a part of a first contact electrode 215b of the thin film transistor 2, and a part of the first upper electrode 315 of the capacitor 3, which will be described later.

The third conductive layer 16 may include at least one material selected from the group consisting of Ag, Mg, Al, Pt, Pd, Au, Ni, Nd, Ir, Cr, Li, Ca, Mo, Ti, W, MoW, Al/Cu, and combinations thereof. The third conductive layer 16 becomes a part of a second gate electrode 216a and a part of a second contact electrode 216b of the thin film transistor 2, and a part of a second upper electrode 316 of the capacitor 3, which will be described later.

Figure 10:
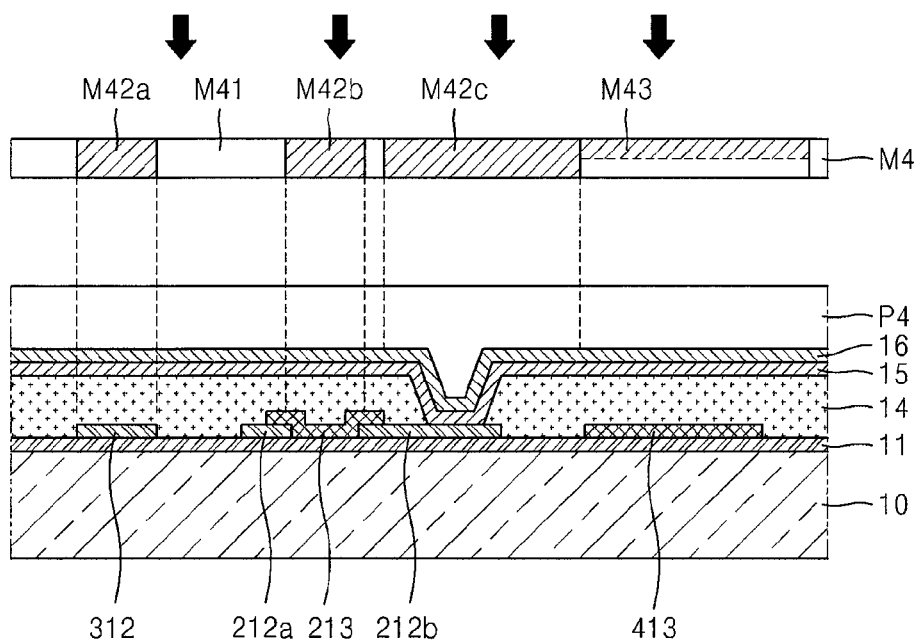

Next, referring to FIG. 10, a fourth mask M4 is arranged on a structure of FIG. 9. Here, the fourth mask M4 may be a half-tone mask including a light-transmitting portion M41, light-blocking portions M42a, M42b, and M42c, and a semi-permeable portion (e.g., a semi-transparent portion) M43. The light-transmitting portion M41 transmits light (e.g., light having a predetermined wavelength band), the light-blocking portions M42a, M42b, and M42c block light, and the semi-permeable portion M43 includes a pattern corresponding to the pixel electrode 415. After arranging the fourth mask M4 having the above pattern on the substrate 10, light (e.g., light having a predetermined wavelength band) is irradiated on a photoresist layer P4.

Then, a photoresist portion corresponding to the light-transmitting portion M41 of the fourth mask M4 is removed, whereas photoresist portions corresponding to the light-blocking portions M42a, M42b, and M42c, and a photoresist portion corresponding to the semi-permeable portion M43 remain. Here, a thickness of the photoresist portion corresponding to the semi-permeable portion M43 is thinner than a thickness of the photoresist portions corresponding to the light-blocking portions M42a, M42b, and M42c, and may be adjusted using a composition or thickness of materials forming a pattern of the semi-permeable portion M43.

By using a pattern formed by the light-transmitting portion M41, the light-blocking portions M42a, M42b, and M42c, and the semi-permeable portion M43 as a mask, the second conductive layer 15 and the third conductive layer 16 on the substrate 10 are etched by using an etching device. Here, a structure of a portion without a photoresist layer is etched first, and a partial thickness of a photoresist layer is etched. Here, the etching may be performed by using any suitable method, such as dry etching or wet etching.

While a first etching process as described above is performed, the second conductive layer 15 and the third conductive layer 16 of portions without a photoresist layer are removed. Also, although the photoresist portion corresponding to the semi-permeable portion M43 is etched, a lower structure of the semi-permeable portion M43 remains, and such a lower structure becomes the pixel electrode 415 of the organic light-emitting display device. Parts of the photoresist portions corresponding to the light-blocking portions M42a, M42b, and M42c remain even after the first etching process, and a second etching process is performed by using the remaining parts of the photoresist portions corresponding to the light-blocking portions M42a, M42b, and M42c as a mask.

After the second etching process, a pixel electrode region, in which a photoresist layer is partially removed, on the third conductive layer 16 is removed, and a part of the second conductive layer 15 becomes the pixel electrode 415.

Figure 11:
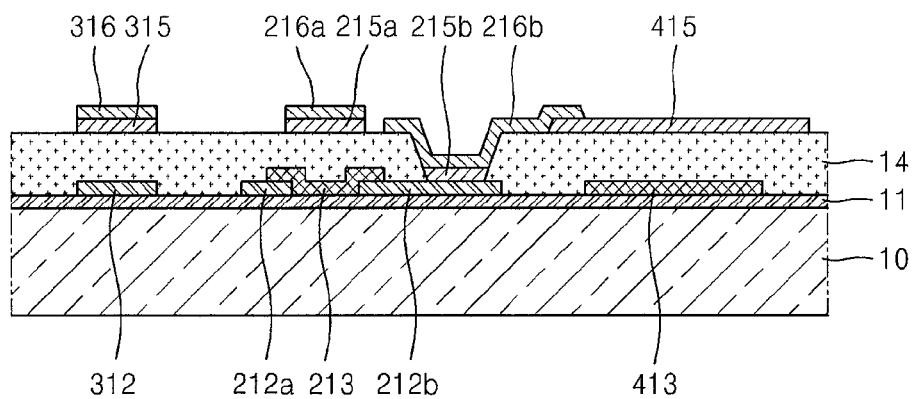

Referring to FIG. 11, the pixel electrode 415, the first and second gate electrodes 215a and 216a and the first and second contact electrodes 215b and 216b of the thin film transistor 2, and the first and second upper electrodes 315 and 316 of the capacitor 3 are concurrently (e.g., simultaneously) patterned on the same structure by using the fourth mask M4. Accordingly, the pixel electrode 415, the first gate electrode 215a of the thin film transistor 2, the first contact electrode 215b of the thin film transistor 2, and the first upper electrode 315 of the capacitor 3 are formed of the same material at the same layer. At the same time, the second gate electrode 216a of the thin film transistor 2, the second contact electrode 216b of the thin film transistor 2, and the second upper electrode 316 of the capacitor 3 are formed of the same material at the same layer.

Figure 12:
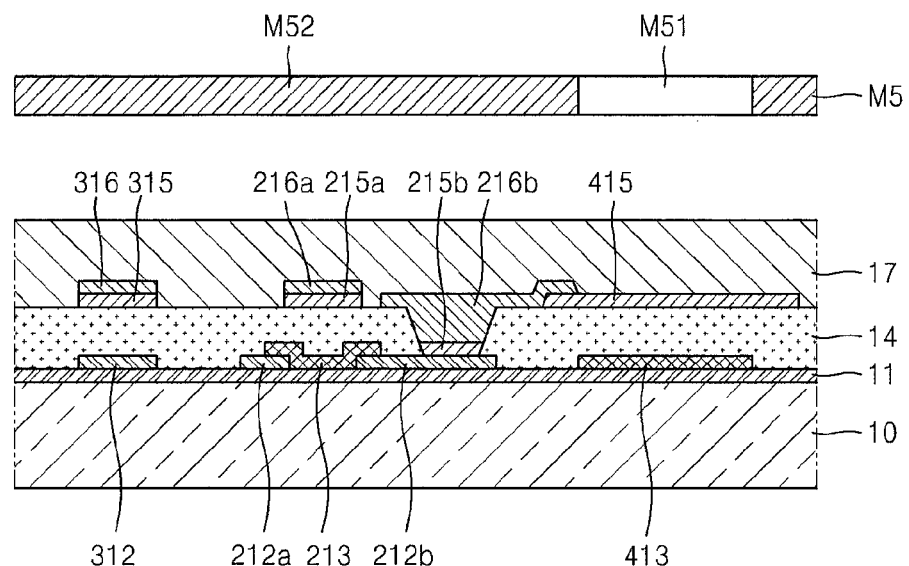

Referring to FIG. 12, a second insulation layer 17 is formed on a structure of FIG. 11, constituting a result of a fourth mask process, and a fifth mask M5 is arranged.

The second insulation layer 17 may be formed by using at least one organic insulation material selected from the group consisting of polyimide, polyimide, acryl resin, benzocyclobutene, phenol resin, and combinations thereof, and a method, such as spin coating. Alternatively, the second insulation layer 17 may be formed of not only the organic insulation material, but also an inorganic insulation material like that of the first insulation layer 14 described above. After an etching process using the fifth mask M5, the second insulation layer 17 operates as a pixel defining layer (PDL) of the organic light-emitting display device, which will be described later.

The fifth mask M5 includes a light-transmitting portion M51 at a location corresponding to the pixel electrode 415, and a light-blocking portion M52 at a remaining portion. When light is irradiated on the fifth mask M5, the second insulation layer 17 and the organic insulating materials of the second insulation layer 17, to which the transmitted light is applied, may be directly removed via dry etching. In the first through fourth mask processes described above, light exposure and developing processes are performed on a photoresist layer, and a lower structure is again patterned by using the developed photoresist layer as a mask, but when an organic insulation material is used like the current embodiment, the second insulation layer 17 may be directly dry-etched without having to use an additional photoresist layer.

Referring to FIG. 13, an opening H2 is formed to expose the pixel electrode 415 by etching a part of the second insulation layer 17, thereby forming a PDL 417 defining a pixel. The PDL 417 has a thickness (e.g., a predetermined thickness) so as to widen an interval between an edge of the pixel electrode 415 and a counter electrode 419 of FIG. 14, thereby preventing an electric field from being concentrated at the edge of the pixel electrode 415. Accordingly, a short circuit between the pixel electrode 415 and the counter electrode 419 may be prevented.

Referring to FIG. 14, an intermediate layer 418, including an organic light-emitting layer, and the counter electrode 419 are formed on the pixel electrode 415 and the PDL 417.

The organic light-emitting layer included in the intermediate layer 418 emits light according to an electrical operation of the pixel electrode 415 and the counter electrode 418. The organic light-emitting layer may be formed of a low molecular or polymer organic material.

When the low molecular organic material is used, the intermediate layer 418 is formed in such a way that a hole transport layer (HTL) and a hole injection layer (HIL) are stacked in a direction of the pixel electrode 415 from on the organic light-emitting layer, and an electron transport layer (ETL) and an electron injection layer (EIL) are stacked in a direction of the counter electrode 419 with respect to the organic light-emitting layer. In addition, the intermediate layer 418 may include various layers if required. Examples of the organic material used to form the intermediate layer 418 may include copper phthalocyanine (CuPc), N,N'-Di(naphthalene-1-yl)-N,N'-diphenyl-benzidine (NPB), and tris-8-hydroxyquinoline aluminum (Alq3).

Alternatively, when the polymer organic material is used, the intermediate layer 418 may only include the HTL in the direction of the pixel electrode 415 based on the organic light emitting layer. Such an HTL is formed on the pixel electrode 415 via an inkjet printing or spin coating method by using poly-(2,4)-ethylene-dihydroxy thiophene (PEDOT) or polyaniline (PANI). The polymer organic light-emitting layer may be formed of PPV, soluble PPVs, or polyfluorene, and a color pattern may be formed via an inkjet printing or spin coating method, or a conventional method such as a thermal transfer type method using a laser.

The counter electrode 419 is deposited on the intermediate layer 418 including the organic light-emitting layer. In the organic light-emitting display device according to one embodiment, the pixel electrode 415 is used as an anode, and the counter electrode 419 is used as a cathode, but polarities of the pixel electrode 415 and the counter electrode 419 may be the opposite in other embodiments.

When the organic light-emitting display device is a bottom emission type wherein an image is displayed in a direction of the substrate 10, the pixel electrode 415 may be a transparent electrode and the counter electrode 419 may be a reflective electrode. Here, the reflective electrode may be formed by thinly depositing at least one material having a low work function, such as Ag, Mg, Al, Pt, Pd, Au, Ni, Nd, Ir, Cr, Li, Ca, LiF/Ca, or LiF/Al.

Although not illustrated in FIG. 14, a sealing member and a moisture absorbent for protecting the intermediate layer 418 from external moisture or oxygen may be further formed on the counter electrode 419.

Here, according to an organic light-emitting display device and a method of manufacturing the same, according to embodiments of the present invention, an optical resonance structure is realized by forming the buffer layer 11 and the first insulation layer 14 to each have a multi-layer structure including a plurality of layers.

The optical resonance structure will now be described in detail.

When the first and second gate electrodes 215a and 216a, and the pixel electrode 415 are formed of the same material at the same layer so as to reduce a number of masks in the bottom emission type as described above, the first and second gate electrodes 215a and 216a are formed in double layers, whereas the pixel electrode 415 is formed in a single layer of transparent electrode. As such, the pixel electrode 415 does not have a reflective characteristic in the bottom emission type organic light-emitting display device using the single layer of transparent electrode as the pixel electrode 415, and thus an optical resonance effect is not generated between the counter electrode 419 and the pixel electrode 415. At this time, when the intermediate layer 418 emits light, the increasing of light efficiency and color reproduction range is limited.

In order to realize an optical resonance effect in the bottom emission type organic light-emitting display device having a reduced number of masks, the organic light-emitting display device according to one embodiment includes the active layer 413 below the pixel electrode 415, and the buffer layer 11 and the first insulation layer 14, which have a multi-layer structure, so that the active layer 413, the buffer layer 11, and the first insulation layer 14 operate as reflective layers.

Figure 15:
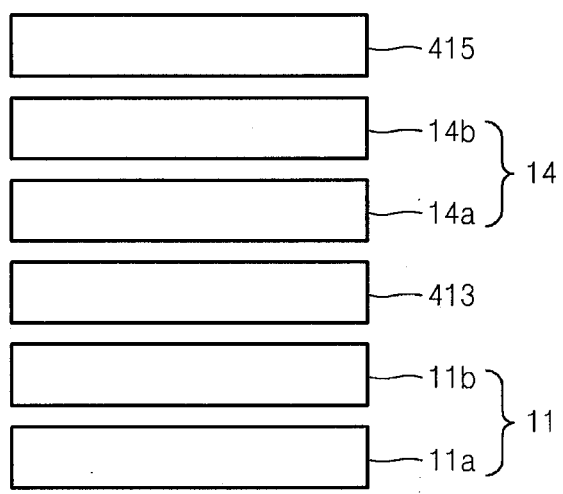
FIG. 15 is a diagram schematically illustrating a resonance structure of the organic light-emitting display device of FIG. 14.

FIG. 15 is a diagram schematically illustrating a resonance structure of the organic light-emitting display device 4 of FIG. 14. Referring to FIG. 15, the buffer layer 11, including two layers formed of materials having different refractive indexes, is formed on the substrate 10. Here, a lower buffer layer 11a may be an inorganic insulation layer formed of SiNx, and an upper buffer layer 11b may be an inorganic insulation layer formed of SiOx. Here, the lower buffer layer 11a and the upper buffer layer 11b may be formed of materials having different refractive indexes. The active layer 413 is formed on the buffer layer 11, and the first insulation layer 14 including two layers formed of materials having different refractive indexes is formed on the active layer 413. Here, a first lower insulation layer 14a may be an inorganic insulation layer formed of SiOx, and a first upper insulation layer 14b may be an inorganic insulation layer formed of SiNx. Here, the buffer layer 11 and the first insulation layer 14 each include two layers, but the number of layers included in the buffer layer 11 and the first insulation layer 14 are not limited thereto, and may be at least three.

Here, in order to form the optical resonance structure, a distance d between the buffer layer 11 and the counter electrode 419 may satisfy a condition of forming resonance. A stationary wave is generated when a wave of light on surfaces of the buffer layer 11 and the counter electrode 419 forms a node, and a condition of generating a node is defined in Equation 1.

$$\sum_{n}^{d} n \cdot d = \frac{\lambda}{2} \cdot m (m = 1, 2, 3 \ldots) \qquad \text{Equation 1}$$

Here, n denotes a refractive index of a layer, d denotes a thickness of the layer for forming a node, and m is a natural number.

A resonance condition is within the above range by a general image dipole or other conditions. Accordingly, a thickness of a layer having a resonance condition, i.e., the distance d between the buffer layer 11 and the counter electrode 419 is within a range of Equation 2 below.

$$\frac{\lambda}{2} \cdot m - \frac{\lambda}{10} \le D \le \frac{\lambda}{2} \cdot m + \frac{\lambda}{10} \qquad \text{Equation 2}$$

Here, m denotes a natural number and λ denotes a wavelength of corresponding light.

Each of the thicknesses of the buffer layer 11 and the first insulation layer 14 is set to adjust the distance d, thereby increasing efficiency of light emitted from the intermediate layer 418 to increase an entire resonance effect. As such, when a suitable thickness of each layer is set, the active layer 413, the buffer layer 11, and the first insulation layer 14 operate as dielectric Bragg reflector (DBR) to reflect part of light emitted from the intermediate layer 418, and thus the buffer layer 11 and the counter electrode 419 form the optical resonance structure.

According to the organic light-emitting display device and the method of manufacturing the same, according to one embodiment of the present invention, the organic light-emitting display device is manufactured using a small number of masks while realizing the optical resonance effect, and thus light efficiency may be increased. Moreover, manufacturing costs may be reduced as the number of masks is reduced and as the manufacturing processes are simplified.

Figure 29:
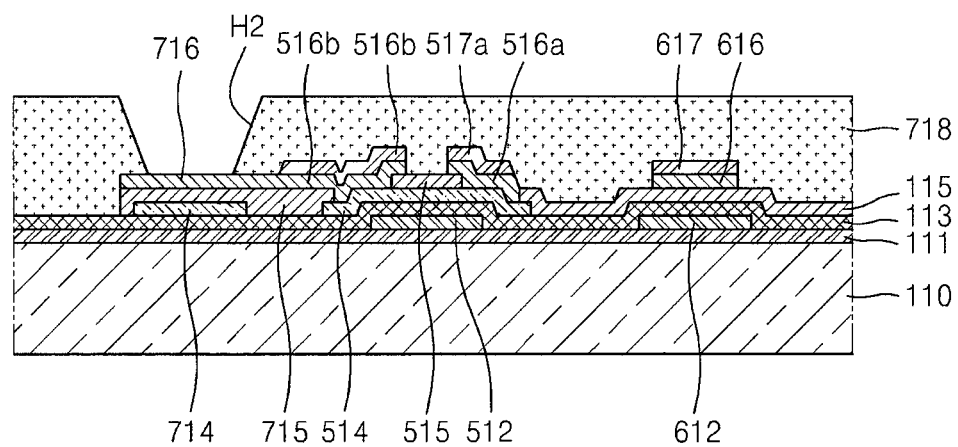
Figure 30:
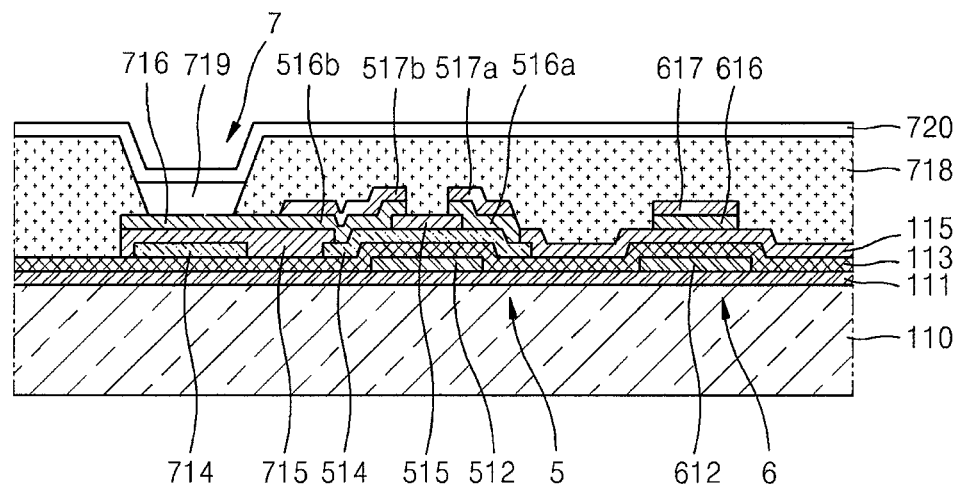
FIG. 30 is a cross-sectional view schematically illustrating an organic light-emitting display device manufactured according to the method of FIGS. 16 through 29.

FIGS. 16 through 29 are cross-sectional views for illustrating a method of manufacturing an organic light-emitting display device, according to another embodiment of the present invention, and FIG. 30 is a cross-sectional view schematically illustrating an organic light-emitting display device manufactured according to the method of FIGS. 16 through 29.

Referring to FIGS. 16 through 30, the organic light-emitting display device according to one embodiment includes a substrate 110, a buffer layer 111, a thin film transistor 5, a capacitor 6, and an organic light-emitting device 7.

Figure 16:
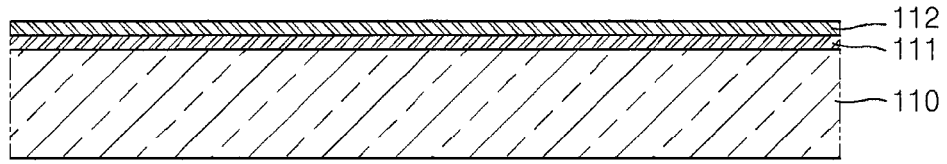
FIGS. 16 through 29 are cross-sectional views illustrating a method of manufacturing an organic light-emitting display device, according to another embodiment of the present invention.

Referring to FIG. 16, the buffer layer 111 and a first conductive layer 112 are sequentially formed on the substrate 110.

The substrate 110 may be formed of a transparent glass material including $SiO_2$ as a main component. Alternatively, the substrate 110 may be formed of an opaque material or another material, such as plastic. However, when the organic light-emitting display device is a bottom emission type, wherein an image is displayed from (or through) the substrate 110, the substrate 110 is formed of a transparent material.

The buffer layer 111 may be formed on a top surface of the substrate 110 so as to flatten (e.g., planarize) the substrate 110 and prevent impure elements from penetrating into the substrate 110. The buffer layer 111 may be formed by depositing $SiO_2$ and/or SiNx by using any deposition method, such as a PECVD method, an APCVD method, or an LPCVD method. Alternatively, the buffer layer 111 may include at least one of $TiO_2$, HfO2, $Al_2O_3$, HfSiOx, $Ta_2O_5$, $Nb_2O_5$, $ZrO_2$, $Y_2O_3$, or $La_2O_3$. Here, in the organic light-emitting display device according to one embodiment of the present invention, the buffer layer 111 forms an optical resonance structure as the buffer layer 111 has a multi-layer structure wherein materials having different refractive indexes are sequentially stacked on one another. The optical resonance structure of the buffer layer 111 will be described in detail later.

The first conductive layer 112 is deposited on the buffer layer 111. The first conductive layer 112 may include at least one material selected from the group consisting of Ag, Mg, Al, Pt, Pd, Au, Ni, Nd, Ir, Cr, Li, Ca, Mo, Ti, W, MoW, Al/Cu, and combinations thereof. Alternatively, the first conductive layer 112 may include at least one material selected from the group consisting of transparent materials, such as ITO, IZO, ZnO, and In2O3.

The first conductive layer 112 becomes a part of gate electrode 512 of the thin film transistor 5, and a part of a lower electrode 612 of the capacitor 6, which will be described later.

Figure 17:
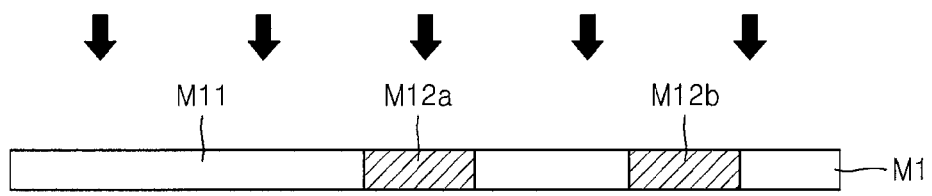
Figure 17:
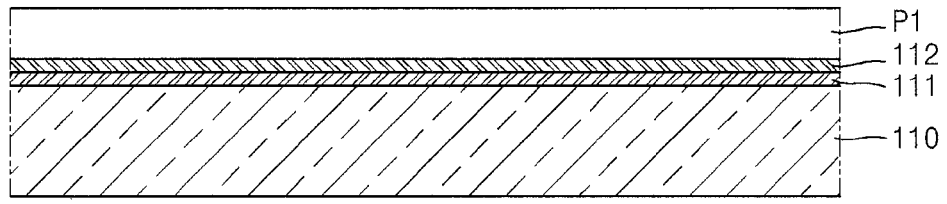

Next, referring to FIG. 17, a photoresist layer P1 is formed by removing a photoresist coated on top of a structure of FIG. 16 by using a solvent via pre-baking or soft baking, and then a first mask M1, including a pattern (e.g., a predetermined pattern) for patterning the photoresist layer P1, is prepared and arranged on the substrate 110. Here, the first mask M1 includes a light-transmitting portion M11 and light-blocking portions M12a and M12b. The light-transmitting portion M11 transmits light (e.g., light having a predetermined wavelength band), and the light-blocking portions M12a and M12b block an irradiated light. Then, after light exposure and developing processes on the photoresist layer P1, an etching process is performed on the photoresist layer P1 by using a remaining photoresist layer pattern as a mask.

Figure 18:
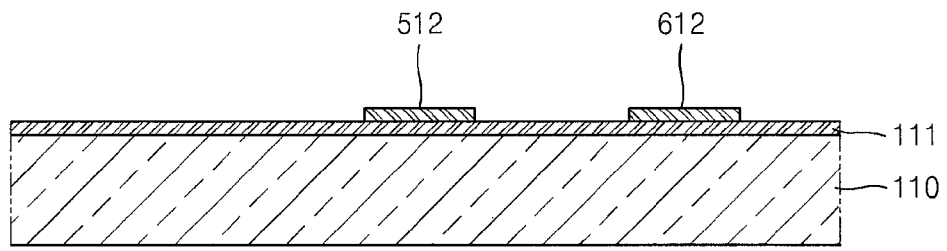

Then, referring to FIG. 18, the gate electrode 512 is formed on the buffer layer 111 as a result of a first mask process. Also, the lower electrode 612 of the capacitor 6 is formed of the same material and at the same layer as the gate electrode 512. For example, the lower electrode 612 may be formed concurrently with the gate electrode 512.

Figure 19:
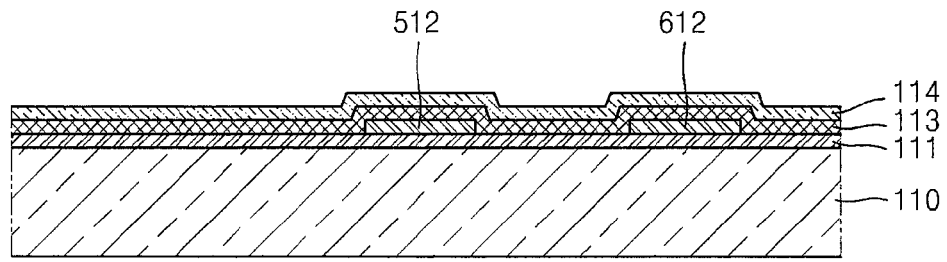

Next, referring to FIG. 19, a first insulation layer 113 is deposited on a structure of FIG. 18, constituting the result of the first mask process, and a semiconductor layer 114 is formed on the first insulation layer 113.

For example, the first insulation layer 113 may be formed by depositing an inorganic insulation layer formed of SiNx or SiOx via a PECVD method, an APCVD method, or an LPCVD method. Alternatively, the first insulation layer 113 may include at least one of $TiO_2$, $HfO_2$, $Al_2O_3$, HfSiOx, $Ta_2O_5$, $Nb_2O_5$, $ZrO_2$, $Y_2O_3$, $La_2O_3$, or AZO. The first insulation layer 113 is located between the gate electrode 512 of the thin film transistor 5 and an active layer 514 to operate as a gate insulation layer of the thin film transistor 5, and at the same time, is located between the lower electrode 612 of the capacitor 6, and a first upper electrode 616 to operate as a first dielectric layer of the capacitor 6, which will be described later. Accordingly, the first insulation layer 113 of the organic light-emitting display device according to one embodiment of the present invention has a multi-layer structure wherein materials having different refractive indexes are sequentially stacked on one another, as will be described later in detail.

The semiconductor layer 114 may be formed of an oxide semiconductor, and in detail, may include oxygen and at least one element selected from the group consisting of Ga, In, Zn, Hf, and combinations thereof. For example, the semiconductor layer 114 may include ZnO, ZnGaO, ZnInO, GaInO, GaSnO, ZnSnO, InSnO, HfInZnO, or ZnGaInO, and for further example, may be a G-I—Z—O layer [a$(In_2O_3)_b$$(Ga_2O_3)$ c(ZnO) layer], wherein a, b, and c are each a real number satisfying a condition of a≥0, b≥0, and c>0. Such a semiconductor layer 114 formed of the oxide semiconductor is patterned into the active layer 514 of the thin film transistor 5, and an active layer 714 of the organic light-emitting device 7.

Figure 20:
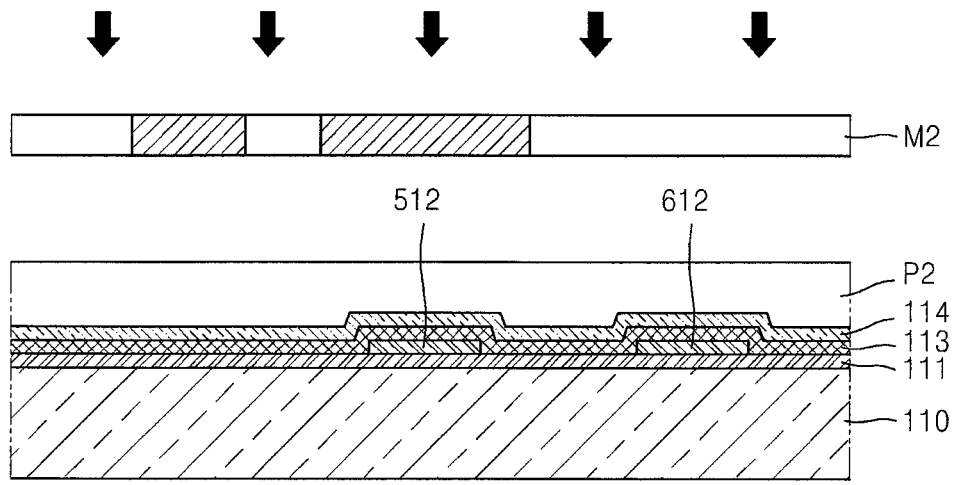

Then, referring to FIG. 20, a photoresist layer P2 is formed by removing a photoresist coated on top of a structure of FIG. 19 by using a solvent via pre-baking or soft baking, and then a second mask M2, including a pattern (e.g., a predetermined pattern) for patterning the photoresist layer P2, is prepared and arranged on the substrate 110. Then, after light exposure and developing processes on the photoresist layer P2, an etching process is performed on the photoresist layer P2 by using a remaining photoresist layer pattern as a mask.

Figure 21:
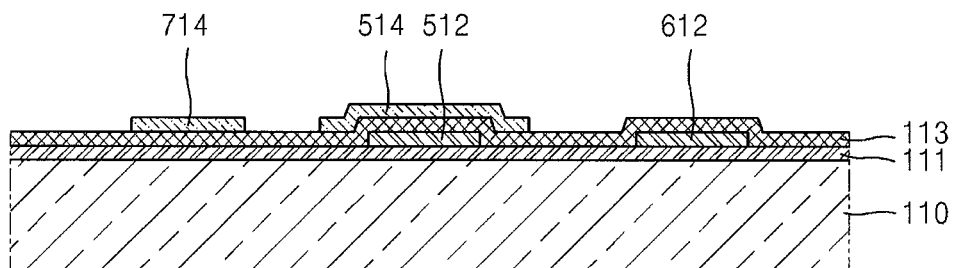

Next, referring to FIG. 21, the active layer 514 of the thin film transistor 5 is formed on top of the first insulation layer 113 as a result of the second mask process. Also, the active layer 714 of the organic light-emitting device 7 is formed of the same material and at the same layer as the active layer 514. For example, the active layer 714 may be formed concurrently with the active layer 514.

Figure 22:
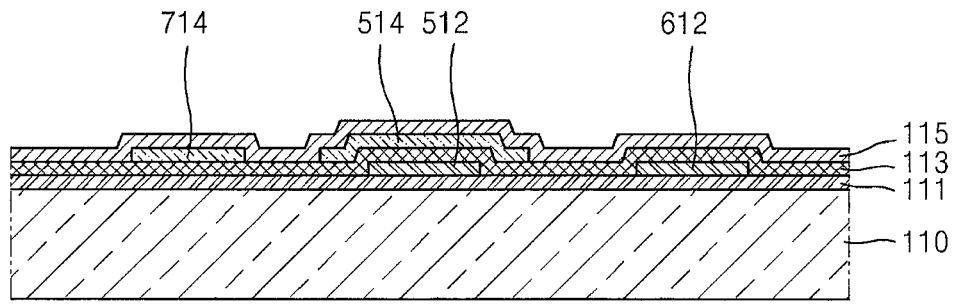

Next, referring to FIG. 22, a second insulation layer 115 is deposited on a structure of FIG. 21, constituting the result of the second mask process.

For example, the second insulation layer 115 may be formed by depositing an inorganic insulation layer formed of SiOx or the like via a PECVD method, an APCVD method, or an LPCVD method. The second insulation layer 115 is located on the active layer 514 of the thin film transistor 5 to operate as an etch stop layer (ESL) of the thin film transistor 5. The ESL is formed specifically to protect a channel of the active layer 514, and as will be described with reference to FIG. 24, may be formed only on the channel of the active layer 514 or, although not illustrated, may be formed to cover the entire active layer 514 excluding regions contacting second source and drain electrodes 517a and 517b. Also, the second insulation layer 115 may be located between the active layer 714 of the organic light-emitting device 7 and a pixel electrode 716, which will be described later, to operate as an insulation layer for resonance of the organic light-emitting device 7. At the same time, the second insulation layer 115 may be located between the lower electrode 612 of the capacitor 6 and the first upper electrode 616 of the capacitor 6, which will be described later, to operate as a second dielectric layer of the capacitor 6.

Figure 23:
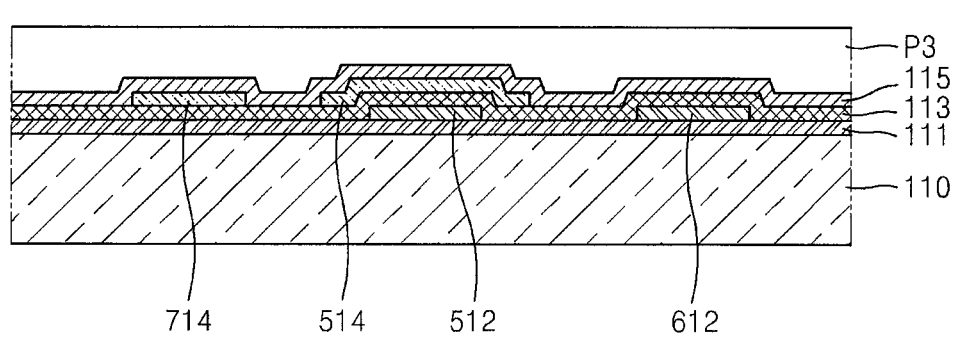

Then, referring to FIG. 23, a photoresist layer P3 is formed by removing a photoresist coated on top of a structure of FIG. 22 by using a solvent via pre-baking or soft baking, and then a second mask M3, including a pattern (e.g., a predetermined pattern) for patterning the photoresist layer P3, is prepared and arranged on the substrate 110. Then, after light exposure and developing processes on the photoresist layer P3, an etching process is performed on the photoresist layer P3 by using a remaining photoresist layer pattern as a mask.

Figure 24:
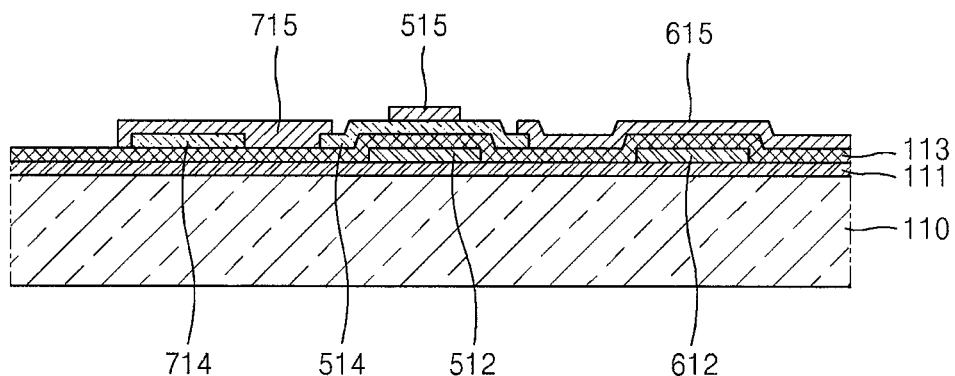

Next, referring to FIG. 24, an ESL 515 of the thin film transistor 5 is formed on top of the active layer 514 of the thin film transistor 5 as a result of a third mask process. At the same time, an insulation layer 715 is formed on the active layer 714 of the organic light-emitting device 7, by using the same material and at the same layer as the ESL 515. Also, an insulation layer 615 is formed on the lower electrode 612 of the capacitor 6, by using the same material and at the same layer as the ESL 515. For example, both the insulation layer 715 and the insulation layer 615 may be formed concurrently with the ESL 515.

Figure 25:
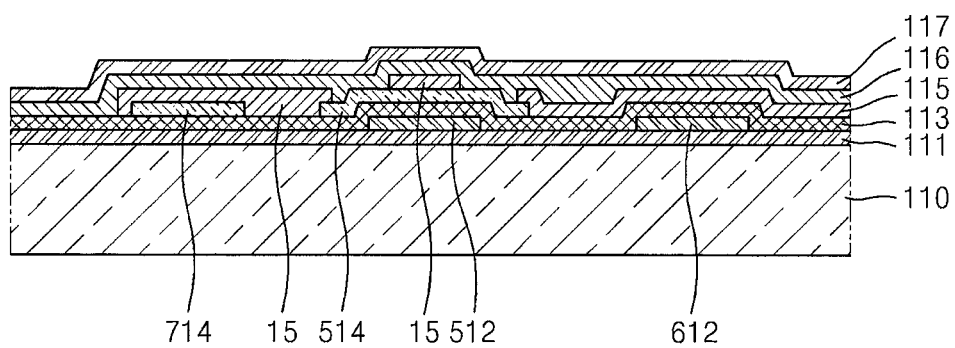

Next, referring to FIG. 25, a second conductive layer 116 and a third conductive layer 117 are sequentially deposited on a structure of FIG. 24, constituting the result of the third mask process.

The second conductive layer 116 may include at least one material selected from transparent materials, such as ITO, IZO, ZnO, and $In_2O_3$. The second conductive layer 116 becomes a part of the pixel electrode 716 of the organic light-emitting display device, a part of a first source electrode 516a and a part of a first drain electrode 516b of the thin film transistor 5, and a part of the first upper electrode 616 of the capacitor 6, which will be described later.

The third conductive layer 117 may include at least one material selected from the group consisting of Ag, Mg, Al, Pt, Pd, Au, Ni, Nd, Ir, Cr, Li, Ca, Mo, Ti, W, MoW, Al/Cu, and combinations thereof. The third conductive layer 117 becomes a part of the second source electrode 517a and a part of the second drain electrode 517b of the thin film transistor 5, and a part of a second upper electrode 617 of the capacitor 6, which will be described later.

Figure 26:
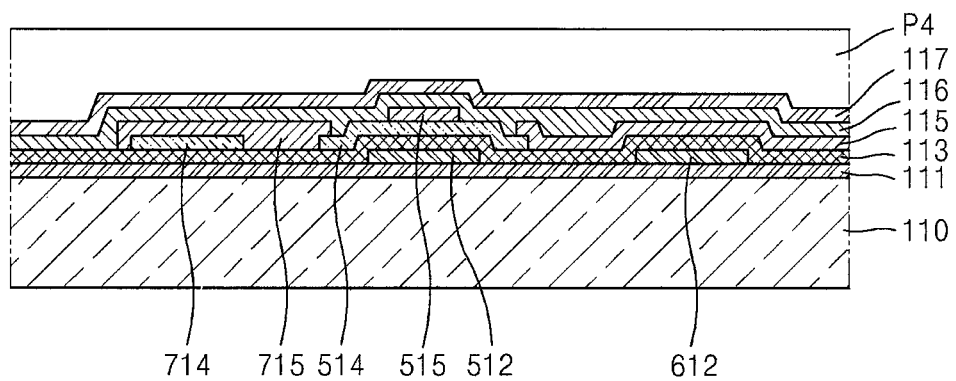

Next, referring to FIG. 26, a fourth mask M4 is arranged on a structure of FIG. 25. Here, the fourth mask M4 may be a half-tone mask including a light-transmitting portion M41, light-blocking portions M42a, M42b, and M42c, and a semi-permeable portion (e.g., a semi-transparent portion) M43. The light-transmitting portion M41 transmits light (e.g., light having a predetermined wavelength band), the light-blocking portions M42a, M42b, and M42c block light, and the semi-permeable portion M43 includes a pattern corresponding to the pixel electrode 415. After arranging the fourth mask M4 having the above pattern on the substrate 110, light (e.g., light having a predetermined wavelength band) is irradiated on a photoresist layer P4.

Then, a photoresist portion corresponding to the light-transmitting portion M41 of the fourth mask M4 is removed, whereas photoresist portions corresponding to the light-blocking portions M42a, M42b, and M42c, and a photoresist portion corresponding to the semi-permeable portion M43 remain. Here, a thickness of the photoresist portion corresponding to the semi-permeable portion M43 is thinner than a thickness of the photoresist portions corresponding to the light-blocking portions M42a, M42b, and M42c, and may be adjusted using a composition or thickness of materials forming a pattern of the semi-permeable portion M43.

By using a pattern formed by the light-transmitting portion M41, the light-blocking portions M42a, M42b, and M42c, and the semi-permeable portion M43 as a mask, the second conductive layer 116 and the third conductive layer 117 on the substrate 110 are etched by using an etching device. Here, a structure of a portion without a photoresist layer is etched first, and a partial thickness of a photoresist layer is etched.

Here, the etching may be performed by using any suitable method, such as dry etching or wet etching.

While a first etching process as described above is performed, the second conductive layer 116 and the third conductive layer 117 of portions without a photoresist layer are removed. Also, although the photoresist portion corresponding to the semi-permeable portion M43 is etched, a lower structure of the semi-permeable portion M43 remains, and such a lower structure becomes the pixel electrode 716 of the organic light-emitting display device. Also, parts of the photoresist portions corresponding to the light-blocking portions M42a, M42b, and M42c remain even after the first etching process, and a second etching process is performed by using the remaining parts of the photoresist portions corresponding to the light-blocking portions M42a, M42b, and M42c as a mask.

After the second etching process, a pixel electrode region, in which a photoresist layer is partially removed, on the third conductive layer 117 is removed, and a part of the second conductive layer 116 becomes the pixel electrode 716.

Figure 27:
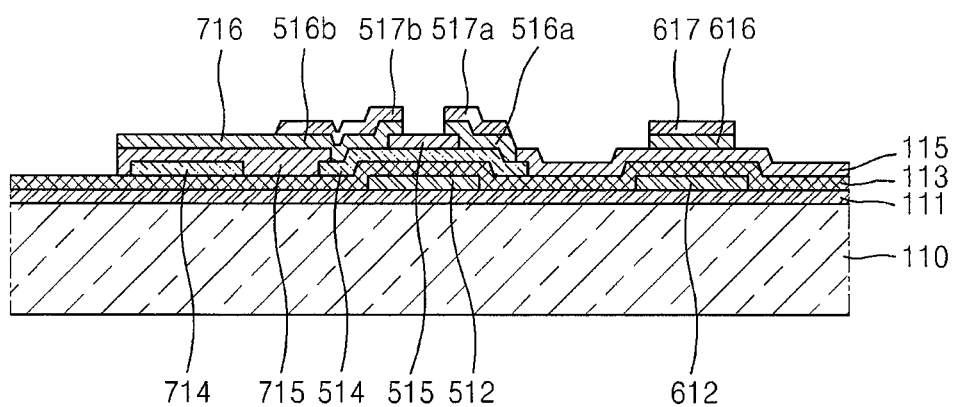

Referring to FIG. 27, the pixel electrode 716, the first and second source electrodes 516a and 517a and the first and second drain electrodes 516b and 517b of the thin film transistor 5, and the first and second upper electrodes 616 and 617 of the capacitor 6 are concurrently (e.g., simultaneously) patterned on the same structure by using the fourth mask M4. Accordingly, the pixel electrode 716, the first source electrode 516a of the thin film transistor 5, the first drain electrode 516b of the thin film transistor 5, and the first upper electrode 616 of the capacitor 6 are formed of the same material and at the same layer. At the same time, the second source electrode 517a of the thin film transistor 5, the second drain electrode 517b of the thin film transistor 5, and the second upper electrode 617 of the capacitor 6 are formed of the same material and at the same layer.

Figure 28:
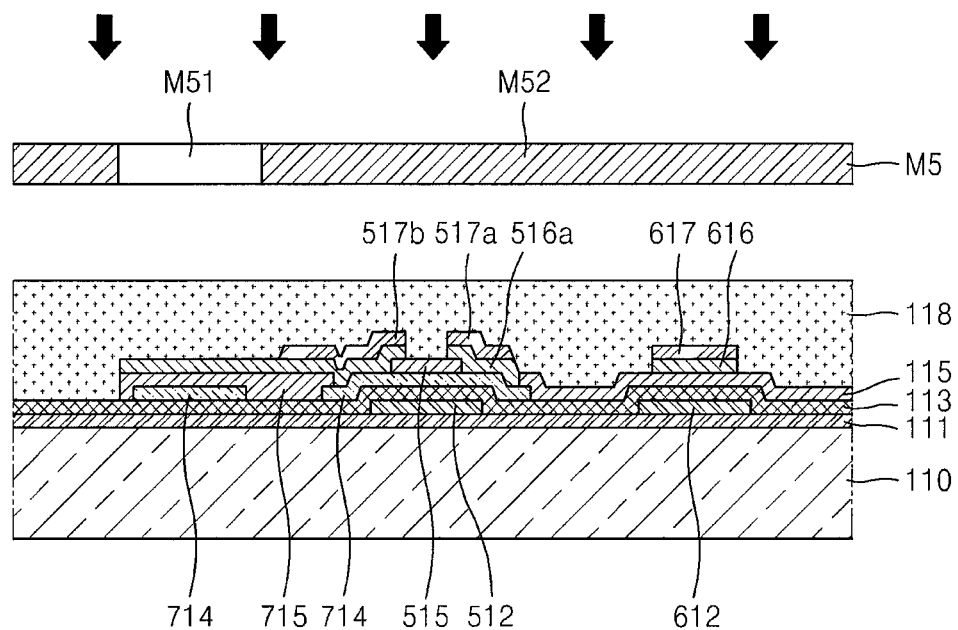

Referring to FIG. 28, a third insulation layer 118 is formed on a structure of FIG. 27, constituting a result of a fourth mask process, and a fifth mask M5 is arranged.

The third insulation layer 118 may be formed by using at least one organic insulation material selected from the group consisting of polyimide, polyamide, acryl resin, benzocyclobutene, phenol resin, and combinations thereof, and a method, such as spin coating. Alternatively, the third insulation layer 118 may be formed of not only the organic insulation material, but also an inorganic insulation material like the first insulation layer 113 described above. After an etching process using the fifth mask M5, the third insulation layer 118 operates as a PDL of the organic light-emitting display device, which will be described later.

The fifth mask M5 includes a light-transmitting portion M51 at a location corresponding to the pixel electrode 716, and a light-blocking portion M52 at a remaining portion. When light is irradiated on the fifth mask M5, the third insulation layer 118 and the organic insulation materials of the third insulation layer 118, to which the transmitted light is applied, may be directly removed via dry etching. In the first through fourth mask processes described above, light exposure and developing processes are performed on a photoresist layer, and a lower structure is again patterned by using the developed photoresist layer as a mask, but when an organic insulation material is used like the current embodiment, the third insulation layer 118 may be directly dry-etched without having to use an additional photoresist layer.

Referring to FIG. 29, an opening H2 is formed to expose the pixel electrode 716 by etching a part of the third insulation layer 118, thereby forming a PDL 718 defining a pixel. The PDL 718 has a thickness (e.g., a predetermined thickness) so as to widen an interval between an edge of the pixel electrode 716 and a counter electrode 720 of FIG. 30, thereby preventing an electric field from being concentrated on the edge of the pixel electrode 716. Accordingly, a short circuit between the pixel electrode 716 and the counter electrode 720 may be prevented.

Referring to FIG. 30, an intermediate layer 719, including an organic light-emitting layer, and the counter electrode 720 are formed on the pixel electrode 716 and the PDL 718. The intermediate layer 719 and the counter electrode 720 are respectively identical to the intermediate layer 418 and the counter electrode 419, and thus detailed descriptions thereof will not be repeated.

According to the organic light-emitting display device, and the method of manufacturing the same, according to the described embodiments of the present invention, in order to realize an optical resonance effect in the bottom emission type organic light-emitting display device, using a reduced number of masks, the organic light-emitting display device includes an active layer 713 below the pixel electrode 715, and the buffer layer 111 and the first insulation layer 113, which have a multi-layer structure, so that the active layer 713, the buffer layer 111, and the first insulation layer 113 operate as reflective layers.

Figure 31:
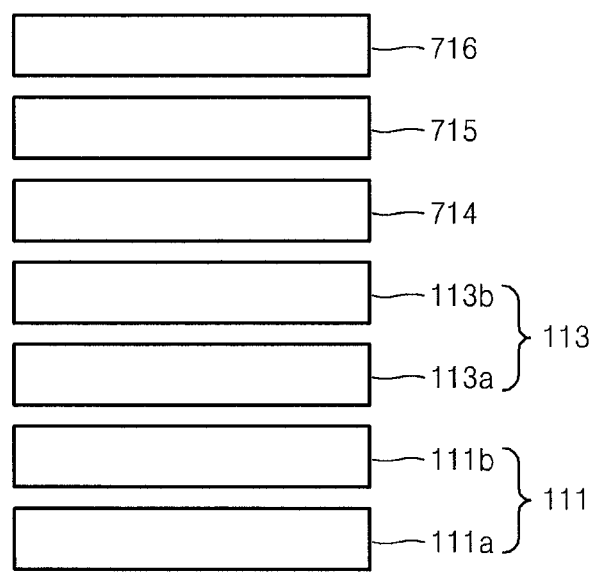
FIG. 31 is a diagram schematically illustrating a resonance structure of the organic light-emitting display device of FIG. 30.

FIG. 31 is a diagram schematically illustrating a resonance structure of the organic light-emitting display device of FIG. 30. Referring to FIG. 31, the buffer layer 111, including two layers formed of materials having different refractive indexes, is formed on the substrate 110. Here, a lower buffer layer 111a may be an inorganic insulation layer formed of SiNx, and an upper buffer layer 111b may be an inorganic insulation layer formed of SiOx. Here, the lower buffer layer 111a and the upper buffer layer 111b may be formed of materials having different refractive indexes. Also, the first insulation layer 113, including two layers formed of materials having different refractive indexes, is formed on the buffer layer 111. Here, a first lower insulation layer 113a may be an inorganic insulation layer formed of SiOx, and a first upper insulation layer 113b may be an inorganic insulation layer formed of SiNx. Here, the buffer layer 111 and the first insulation layer 113 each include two layers, but the number of layers included in the buffer layer 11 and the first insulation layer 14 are not limited thereto, and may be at least three. Also, the insulation layer 715 is formed on the active layer 714, and the pixel electrode 716 is formed on the insulation layer 715. Here, in order to form the optical resonance structure, a distance d between the buffer layer 111 and the counter electrode 720 may satisfy a condition of forming resonance. A stationary wave is generated when a wave of light on surfaces of the buffer layer 111 and counter electrode 720 forms a node, and a condition of generating a node is defined in Equation 1.

$$\sum_{n}^{d} n \cdot d = \frac{\lambda}{2} \cdot m (m = 1, 2, 3 \ldots) \qquad \text{Equation 1}$$

Here, n denotes a refractive index of a layer, d denotes a thickness of the layer for forming a node, and m is a natural number.

A resonance condition is within the above range by a general image dipole or other conditions. Accordingly, a thickness of a layer having a resonance condition, i.e., the distance d between the buffer layer 111 and the counter electrode 720 is within a range of Equation 2 below.

$$\frac{\lambda}{2} \cdot m - \frac{\lambda}{10} \leq D \leq \frac{\lambda}{2} \cdot m + \frac{\lambda}{10} \qquad \text{Equation 2}$$

Here, m denotes a natural number and λ denotes a wavelength of corresponding light.

Each of the thicknesses of the buffer layer 111 and the first insulation layer 113 is set to adjust the distance d, thereby increasing efficiency of light emitted from the intermediate layer 719 to increase an entire resonance effect. As such, when a suitable thickness of each layer is set, the active layer 713, the buffer layer 111, and the first insulation layer 113 operate as DBR to reflect part of light emitted from the intermediate layer 719, and thus the buffer layer 111 and the counter electrode 720 form the optical resonance structure.

According to the organic light-emitting display device and the method of manufacturing the same, according to the described embodiments of the present invention, the organic light-emitting display device is manufactured using a small number of masks and realizes the optical resonance effect, and thus light efficiency may be increased. Moreover, manufacturing costs may be reduced as the number of masks is reduced, and as the manufacturing processes are simplified.

In addition, the organic light-emitting display device is used as an example of a flat panel display device in the embodiments of the present invention, but any one of various display devices, including a liquid crystal display device, may be used as the flat panel display device.

For convenience of description, one thin film transistor and one capacitor are illustrated in drawings for describing the embodiments of the present invention, but the number of the thin film transistors and capacitors are not limited thereto, and a plurality of thin film transistors and a plurality of capacitors may be used as long as the number of mask processes according to the embodiments of the present invention are not increased.

According to the organic light-emitting display device and the method of manufacturing the same according to embodiments of the present invention, light efficiency may be improved since the organic light-emitting display device having the above structure is manufactured using a small number of masks while realizing an optical resonance effect. Further, manufacturing costs may be reduced as the number of masks is reduced, and as the manufacturing processes are simplified.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. An organic light-emitting display device comprising:
    a buffer layer on a substrate, and comprising sequentially stacked materials having different refractive indexes;
    source and drain electrodes on the buffer layer and spaced apart from each other;
    a first active layer of a thin film transistor between the source and drain electrodes, and a second active layer spaced apart from the first active layer at a same layer as and comprising a same material as the first active layer;
    a first insulation layer on the buffer layer, the source and drain electrodes, and the first and second active layers, the first insulation layer comprising sequentially stacked materials having different refractive indexes;

a first gate electrode corresponding to a center region of the first active layer with the first insulation layer therebetween, and a pixel electrode spaced apart from the first gate electrode at a same layer as and comprising a same material as the first gate electrode; and a second gate electrode on the first gate electrode.

2. The organic light-emitting display device of claim 1, wherein the buffer layer comprises at least two layers each comprising at least one of silicon oxide (SiOx), silicon nitride (SiNx), titanium dioxide ($TiO_2$), hafnium dioxide ($HfO_2$), aluminum oxide ($Al_2O_3$), hafnium silicon oxide (HfSiOx), tantalum pentoxide ($Ta_2O_5$), niobium pentoxide ($Nb_2O_5$), zirconium dioxide ($ZrO_2$), yttrium oxide ($Y_2O_3$), or lanthanum oxide ($La_2O_3$).

3. The organic light-emitting display device of claim 2, wherein the buffer layer comprises an upper buffer layer comprising SiOx, and a lower buffer layer comprising SiNx.

4. The organic light-emitting display device of claim 1, wherein the first insulation layer comprises at least two layers each comprising at least one of SiOx, SiNx, $TiO_2$, $HfO_2$, $Al_2O_3$, HfSiOx, $Ta_2O_5$, $Nb_2O_5$, $ZrO_2$, $Y_2O_3$, $La_2O_3$, or aluminum zinc oxide (AZO).

5. The organic light-emitting display device of claim 4, wherein the first insulation layer comprises an upper first insulation layer comprising SiNx, and a lower first insulation layer comprising SiOx.

6. The organic light-emitting display device of claim 1, further comprising:

a lower electrode of a capacitor spaced apart from the source and drain electrodes at a same layer as and comprising a same material as the source and drain electrodes;

a first upper electrode on the lower electrode of the capacitor at a same layer as and comprising a same material as the first gate electrode; and a second upper electrode on the first upper electrode of the capacitor at a same layer as and comprising a same material as the second gate electrode.

7. The organic light-emitting display device of claim 1, further comprising a pixel defining layer at an edge of the pixel electrode so as to expose the pixel electrode.

8. The organic light-emitting display device of claim 1, wherein the first and second active layers comprise an oxide semiconductor.

9. An organic light-emitting display device comprising:

a buffer layer on a substrate and comprising sequentially stacked materials having different refractive indexes;

a gate electrode on the buffer layer;

a first insulation layer on the buffer layer and the gate electrode, and comprising sequentially stacked materials having different refractive indexes;

a first active layer corresponding to the gate electrode with the first insulation layer therebetween, and a second active layer spaced apart from the first active layer at a same layer as and comprising a same material as the first active layer;

a first source electrode and a first drain electrode contacting the first active layer, and a pixel electrode extending from one end of the first drain electrode; and a second source electrode and a second drain electrode on the first source electrode and the first drain electrode, respectively.

10. The organic light-emitting display device of claim 9, wherein the buffer layer comprises at least two layers each comprising at least one of silicon oxide (SiOx), silicon nitride (SiNx), titanium dioxide ($TiO_2$), hafnium dioxide ($HfO_2$), aluminum oxide ($Al_2O_3$), hafnium silicon oxide (HfSiOx), tantalum pentoxide ($Ta_2O_5$), niobium pentoxide ($Nb_2O_5$), zirconium dioxide ($ZrO_2$), yttrium oxide ($Y_2O_3$), or lanthanum oxide ($La_2O_3$).

11. The organic light-emitting display device of claim 10, wherein the buffer layer comprises an upper buffer layer comprising SiOx, and a lower buffer layer comprising SiNx.

12. The organic light-emitting display device of claim 9, wherein the first insulation layer comprises at least two layers each comprising at least one of SiOx, SiNx, $TiO_2$, $HfO_2$, $Al_2O_3$, HfSiOx, $Ta_2O_5$, $Nb_2O_5$, $ZrO_2$, $Y_2O_3$, $La_2O_3$, or aluminum zinc oxide (AZO).

13. The organic light-emitting display device of claim 12, wherein the first insulation layer comprises an upper first insulation layer comprising SiNx, and a lower first insulation layer comprising SiOx.

14. The organic light-emitting display device of claim 9, further comprising:

a lower electrode of a capacitor spaced apart from the gate electrode at a same layer as and comprising a same material as the gate electrode;

a first upper electrode on the lower electrode of the capacitor at a same layer as and comprising a same material as the first source electrode and the first drain electrode; and a second upper electrode on the first upper electrode of the capacitor at a same layer as and comprising a same material as the second source electrode and the second drain electrode.

15. The organic light-emitting display device of claim 9, further comprising a pixel defining layer at an edge of the pixel electrode so as to expose the pixel electrode.

16. The organic light-emitting display device of claim 9, wherein the first and second active layers comprise an oxide semiconductor.

* * * * *